US006204174B1

(12) United States Patent
Glew et al.

(10) Patent No.: US 6,204,174 B1
(45) Date of Patent: Mar. 20, 2001

(54) METHOD FOR HIGH RATE DEPOSITION OF TUNGSTEN

(75) Inventors: Alexander D. Glew, Los Altos, CA (US); Andrew D. Johnson, Doylestown, PA (US); Ravi Rajagopalan; Steve Ghanayem, both of Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/977,831

(22) Filed: Nov. 25, 1997

(51) Int. Cl.$^7$ ..................................................... H01L 21/44
(52) U.S. Cl. ..................... 438/680; 438/683; 438/685; 438/780; 427/124; 427/126.1; 427/126.2
(58) Field of Search ............................. 427/124, 126.1, 427/126.2; 438/780, 680, 683, 685

(56) References Cited

U.S. PATENT DOCUMENTS

| 4,728,389 | 3/1988 | Logar ..................................... 156/612 |
| 5,061,444 | 10/1991 | Nazaroff et al. ......................... 422/40 |
| 5,064,686 | * 11/1991 | McGeary ............................... 427/124 |
| 5,391,394 | 2/1995 | Hansen ................................... 427/124 |
| 5,472,550 | 12/1995 | Periasamy ............................. 156/345 |
| 5,482,749 | 1/1996 | Telford et al. ......................... 427/578 |
| 5,500,249 | 3/1996 | Telford et al. ......................... 427/255 |
| 5,522,933 | 6/1996 | Geller et al. ....................... 118/723 E |
| 5,558,910 | 9/1996 | Telford et al. ......................... 427/255 |

OTHER PUBLICATIONS

R. Duguid et al., "The Impact of Gas Purity on the Quality of CVD–Grown Films," *Proceeding of the Satellite Symposium to ESSDERC 93 Grenoble/France—The Electrochemical Society, Inc.*, vol. 93–15, pp. 140–146, 1993.

D. Flamm, "Feed Gas Purity and Environmental Concerns in Plasma Etching—Part 2," *Solid State Technology*, pp. 43–50, Nov. 1993.

G. Zau et al., "Threshold Levels and Effects of Feed Gas Impurities on Plasma Etching Processes," *J. Electrochem. Soc.*, vol. 137, No. 11, pp. 3526–3536, Nov. 1990.

G. Zau et al., "Effects of $O_2$ Feed Gas Impurity on $Cl_2$ Based Plasma Etching of Polysilicon," *J. Electrochem. Soc.*, vol. 139, No. 1, pp. 250–256, Jan. 1992.

C.J. Mogab et al., "Plasma Etching of Si and $SiO_2$—The Effect of Oxygen Additions to $CF_4$ Plasmas," *J. Appl. Phys.*, vol. 49, No. 7, pp. 3796–3803, Jul. 1978.

* cited by examiner

*Primary Examiner*—David Nelms
*Assistant Examiner*—Reneé R. Berry
(74) *Attorney, Agent, or Firm*—Townsend and Townsend and Crew

(57) ABSTRACT

A method and apparatus to control the deposition rate of a refractory metal film in a semiconductor fabrication process by controlling a quantity of ethylene present. The method includes placing a substrate in a deposition zone, of a semiconductor process chamber, flowing, into the deposition zone, a process gas including a refractory metal source, an inert carrier gas, and a hydrocarbon. Typically, the refractory metal source is tungsten hexafluoride, $WF_6$, and the inert gas is argon, Ar. The ethylene may be premixed with either the argon or the tungsten hexafluoride to form a homogenous mixture. However, an in situ mixing apparatus may also be employed.

15 Claims, 8 Drawing Sheets

METHOD FOR HIGH RATE DEPOSITION OF TUNGSTEN

BACKGROUND OF THE INVENTION

The present invention relates to the fabrication of integrated circuits. More particularly, the invention provides a technique, including a method and apparatus, for improving the deposition rate of refractory metal layers.

Deposition of refractory metals, such as tungsten, over a semiconductor substrate is a common step in the formation of some integrated circuit (IC) structures. For example, tungsten is commonly used to provide electrical contact to portions of a semiconductor substrate. These electrical contacts are usually provided through openings in an insulation layer, such as a silicon dioxide layer, formed over the substrate. One method used to form such contacts includes the chemical vapor deposition (CVD) of tungsten to fill the opening after an initial layer of titanium nitride has been deposited in the opening. As another example, tungsten is sometimes used to form metal lines over a semiconductor substrate.

One CVD technique that has been employed to deposit tungsten films in the semiconductor industry uses tungsten hexafluoride ($WF_6$) and a hydrogen reducing agent, e.g., $H_2$, as precursor gases. This technique includes two main steps: nucleation and bulk deposition. The nucleation step grows a thin layer of tungsten which acts as a growth site for subsequent film. In addition to $WF_6$ and $H_2$, the process gas used in the nucleation step of this technique includes silane ($SiH_4$), and may also include nitrogen ($N_2$) and argon. A bulk deposition step then is used to form the tungsten film. The bulk deposition gas is a mixture containing $WF_6$, $H_2$, $N_2$, and Ar.

Advances in integrated circuit technology have lead to a scaling down of device dimensions and an increase in chip size and complexity. This has necessitated improved methods for deposition of refractory metals, particularly tungsten which has led to a constant endeavor to decrease the quantity of impurities, such as ethylene, deposited in the refractory metal layers. The aforementioned impurities may have deleterious effects on the refractory metal layer, depending upon the nature of the impurity and the quantity present therein. Over the past ten years, impurity control has been successful in substantially reducing impurities attributable to the ambient environment in which refractory metal layers are formed so that greater than 80% of all impurities now present are a direct result of the process. One such source is the contaminants present in the process gases employed to form refractory metal layers. As a result, many process gases are produced in purified form so that there is less than ten, 10, parts of contaminants for every one billion, 1,000,000,000 parts of process gas. Such purification greatly increases the cost of the process gas and, therefore, the cost of depositing a refractory metal layer.

What is needed, therefore, is an improved method for depositing refractory metal layers that lowers the cost of producing the same.

SUMMARY OF THE INVENTION

The present invention provides a method and apparatus for controlling a deposition rate of a refractory metal layer, such a tungsten, on a silicon substrate, as a function of an amount of contaminants present in a process gas. The present invention is based upon the discovery that the presence of ethylene, $C_2H_4$, in a process gas has an effect on the deposition rate of a tungsten layer.

The method of the present invention includes placing a substrate in a deposition zone, of a semiconductor process chamber, flowing, into the deposition zone, a process gas including a refractory metal source, an inert carrier gas, and a hydrocarbon. Typically, the refractory metal source is tungsten hexafluoride, $WF_6$, the inert gas is argon, Ar, and the hydrocarbon is ethylene, $C_2H_4$. The ethylene may be premixed with either the argon gas or the tungsten hexafluoride source to form a homogenous mixture. However, it is also possible to mix the ethylene with either the argon gas or the tungsten hexafluoride source, in situ, anterior to the process chamber.

In an exemplary embodiment of the method in accordance with the present invention, a substrate having an anisotropic surface is placed in a deposition zone of a substrate process chamber. The flow rate of the $WF_6$ gas is between 60 and 200 sccm, with 95 sccm being preferred. The flow rate of the Ar gas is between 1,000 and 6,000 sccm, depending upon the chamber temperature. Were the ethylene premixed with the argon gas or the tungsten hexafluoride source, the minimum quantity of ethylene present would be no less than 100 parts for every 1,000,000,000 parts of the process gas. The maximum quantity of ethylene present would be no greater than 10,000 parts for every 1,000,000,000 parts of the process gas. Were the ethylene mixed, in situ with either the argon gas or the tungsten hexafluoride source, the mixture rate would be established so that the aforementioned quantities are obtained in the process chamber.

These and other embodiments of the present invention, as well as its advantages and features are described in more detail in conjunction with the text below and attached figures.

DETAILED DESCRIPTION OF THE SPECIFIC EMBODIMENTS

I. Exemplary CVD System

Figure 1:
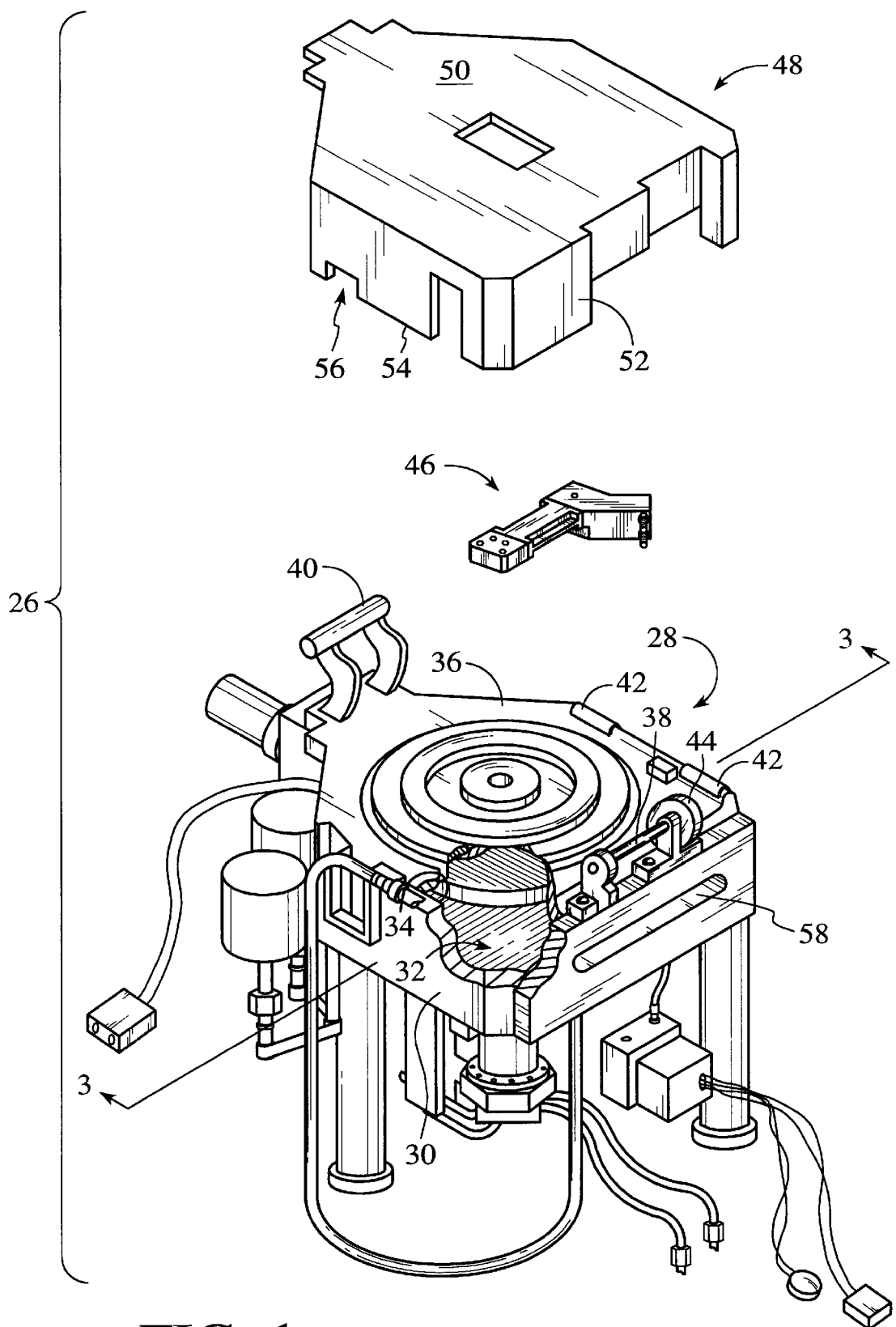
FIG. 1 is a perspective view of a chemical vapor deposition (CVD) apparatus according to the present invention.

Referring to FIG. 1, a suitable chemical vapor deposition (CVD) apparatus 26 in which the method of the present invention can be carried out is shown as including an enclosure assembly 28 formed from a process-compatible material, such as aluminum or anodized aluminum. The enclosure assembly 28 includes a housing 30, defining a process chamber 32 with an opening 34, and a vacuum lid 36. The vacuum lid 36 is pivotally coupled to the housing 30 via a hinge 38 to selectively cover the opening 34. A handle 40 is attached to the vacuum lid 36, opposite to the hinge 38. The handle 40 facilitates moving the vacuum lid 36 between opened and closed positions. In the opened position, the opening 34 is exposed, allowing access to the process chamber 32. In the closed position, the vacuum lid 36 covers the opening 34, forming a fluid- tight seal therewith. To that end, lid clamps 42 may be employed to resiliently bias the vacuum lid 36 against the housing 30. The hinge 38, however, includes a locking ratchet mechanism 44 to prevent the vacuum lid 36 from unintentionally moving into the closed position.

A gas distribution assembly 46 is typically attached to the vacuum lid 36. The gas distribution assembly 46 delivers reactive and carrier gasses into the process chamber 32, discussed more fully below. A cover 48 is in superimposition with the vacuum lid 36 and adapted to enshroud the gas distribution assembly 46. To that end, the cover 48 includes a cover portion 50 lying in a plane that extends parallel to a plane in which the vacuum lid 36 lies. A side wall 52 extends from the cover portion 50, terminating in a periphery 54. The contour of the periphery 54 typically matches the contour of the components of the apparatus 26 disposed on the vacuum lid 36. For example, the periphery 54 may include recessed portions 56 which are positioned to receive one of the lid clamps 42 when the cover 45 is seated against the vacuum lid 36. To facilitate access to the process chamber 32, without compromising the fluid-tight seal between the vacuum lid 36 and the housing 30, a slit valve opening 58 is present in the housing 30, as well as a vacuum lock door (not shown). The slit valve opening 58 allows transfer of a wafer (not shown) between the process chamber 32 and the exterior of the apparatus 26. The aforementioned transfer may be achieved by any conventional wafer transfer assembly (not shown). An example of a conventional robotic wafer transfer assembly is described in commonly assigned U.S. Pat. No. 4,951,601 to Maydan, the complete disclosure of which is incorporated herein by reference.

Figure 2:
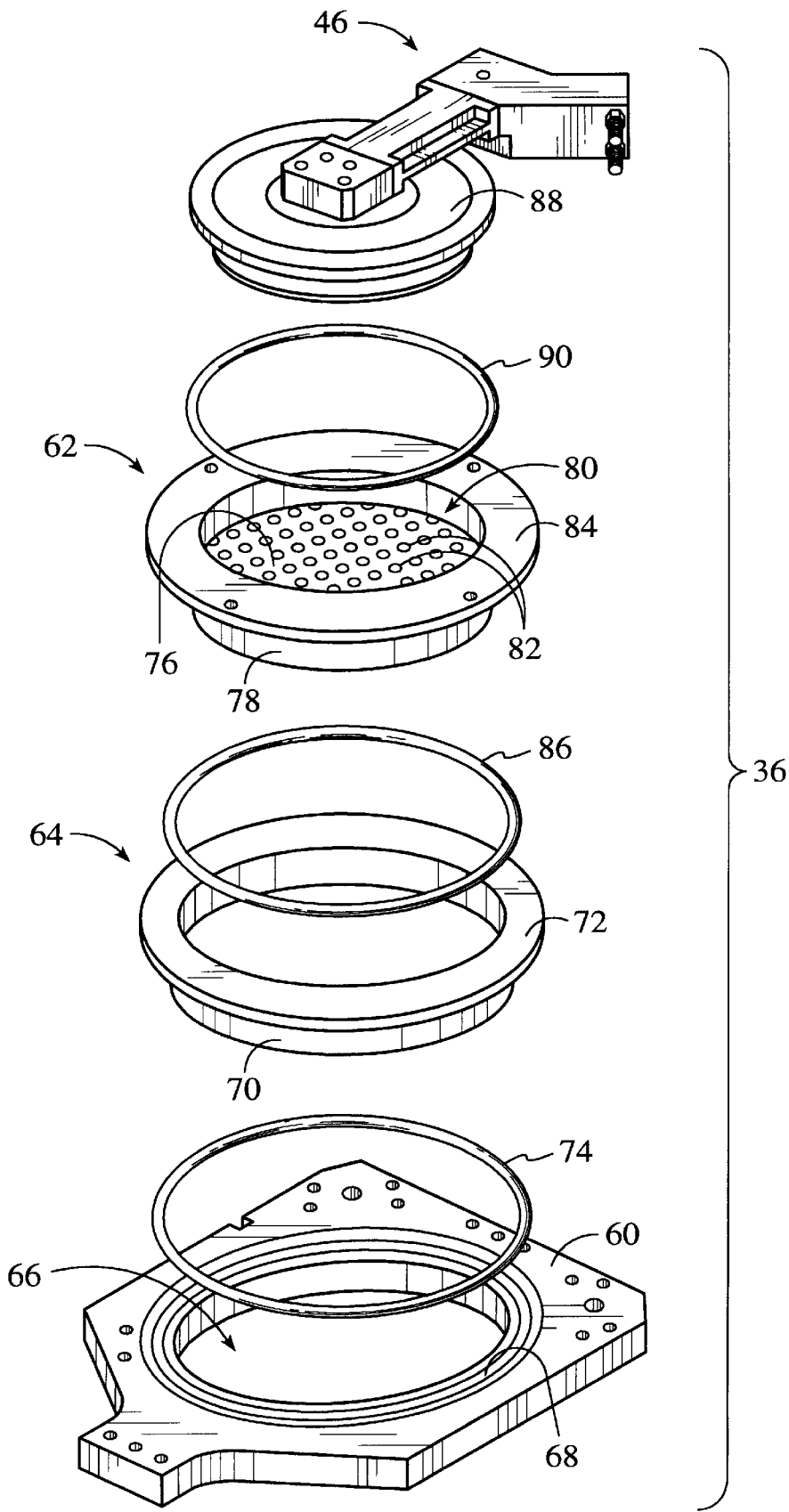
FIG. 2 is an exploded perspective view of a lid employed on the CVD apparatus shown in FIG. 1.

Referring to FIG. 2, the vacuum lid 36 includes a base plate 60, a gas distribution plate 62 and a sleeve 64. The base plate 60 has a centrally disposed aperture 66 and a recessed periphery 68, surrounding the aperture 66. The sleeve 64 has a shape complementary to the shape of the aperture 66 so as to fit therein. Typically, the sleeve 64 includes a cylindrical wall 70, which fits into the aperture 66, with a circular flange 72 extending from one end. The circular flange 72 seats against the recessed periphery 68 when the sleeve 64 is placed in a final seating position. To maintain fluid-tight integrity between the sleeve 64 and the base plate 60 a sealing member 74, such as gasket, is positioned between the recessed periphery 68 and the circular flange 72. The gas distribution plate 62 includes a circular base surface 76 and an annular side surface 78 extending from, and transversely to, the base surface 72, terminating in opening 80. A plurality of apertures 82 are formed in the circular base surface 76. An annular flange 84 extends from the opening 80 and transversely to the annular side surface 78 and seats against the circular flange 72 of the sleeve 64 when placed in a final seating position. In the final seating position, both the circular base surface 76 and the annular side surface 78 are encircled by the sleeve 64. A gasket 86 is positioned between the circular flange 72 and the annular flange 84 to ensure there is a fluid-tight seal therebetween. The gas distribution assembly 46 includes a lid portion 88 which fits over the opening 80 and rests against the annular flange 84. A gasket 90 is disposed between the cover portion 88 and the annular flange 84 to form a fluid-tight seal therebetween.

Figure 3:
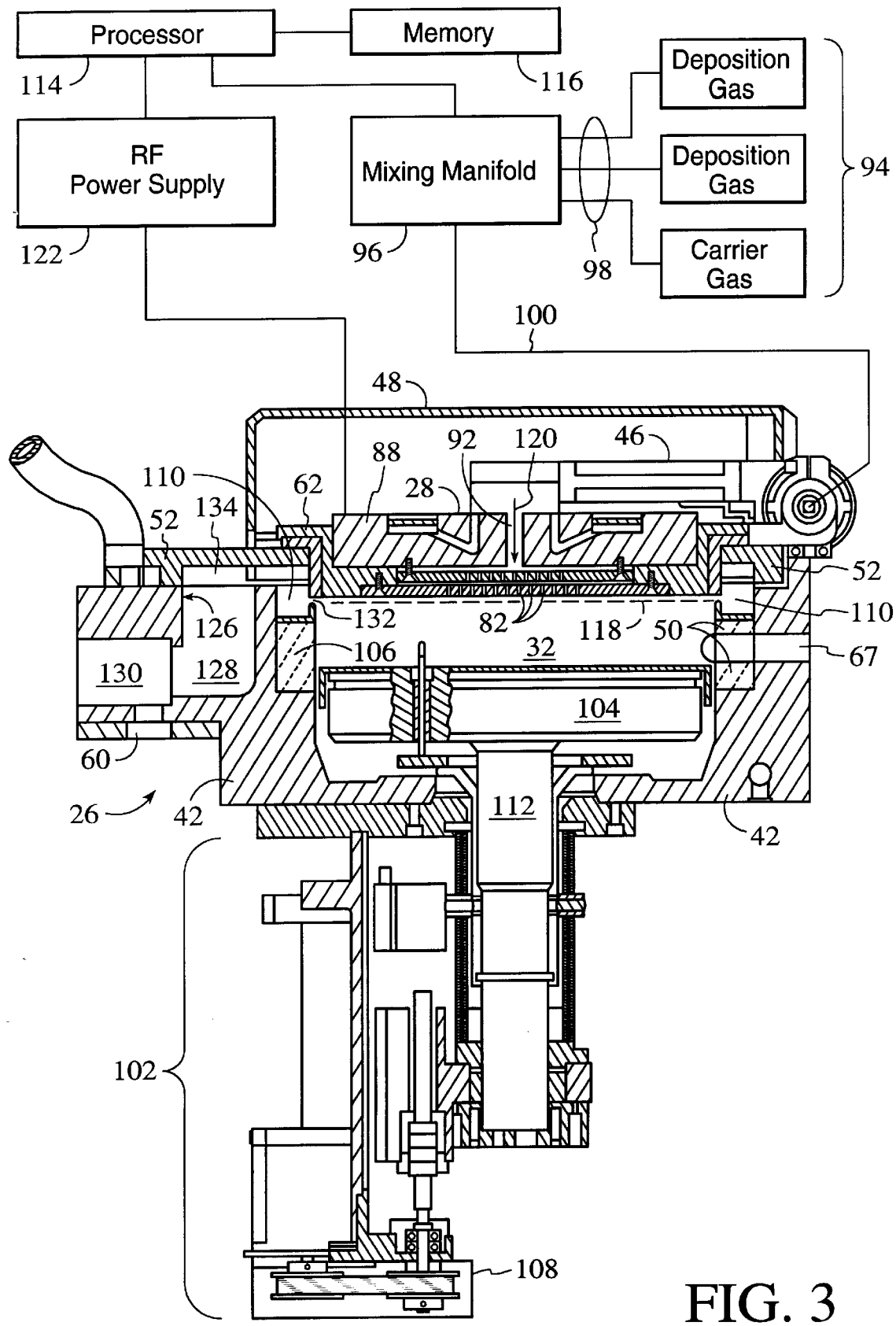
FIG. 3 is a cross-sectional view of the chemical vapor deposition apparatus shown above in FIG. 1.

Referring to FIG. 3, the gas distribution assembly 46 is attached to the lid portion 88 in any conventional manner, e.g., by bolting, brazing and the like. The lid portion 88 includes a throughway 92 to place the gas distribution assembly 46 in fluid communication with the process chamber 32. A supply 94 of deposition and carrier gases is in fluid communication with the gas distribution assembly 46 via a mixing manifold 96. Specifically, a plurality of supply lines 98 are coupled between the supply 94 and the mixing manifold 96. The carrier and deposition gases may be intermingled in the mixing manifold 96 before flowing into the gas distribution assembly 46 via conduit 100. Typically, the supply line for each supply of gas includes (i) several safety shut-off valves (not shown) that may be employed to terminate gas flow into the process chamber 32 either manually or automatically. Additionally, mass flow controllers (also not shown) may be employed to measure the flow of gas through each of the supply lines 98. This structure is particularly useful if the supply 94 includes a quantity of toxic gases.

Disposed within the process chamber 32 is a heater/lift assembly 102 coupled to a pedestal 104, and a process chamber liner 106. The pedestal 104 is positioned between the heater/lift assembly 102 and the vacuum lid 36, when the vacuum lid 36 is in the closed position. The heater lift assembly 102 is operably connected to a motor 108 to be controllably moved so as to vary the distance between the pedestal 104 and the vacuum lid 36. Information concerning the position of the pedestal 104 within the process chamber 32 is provided by a sensor (not shown). The process chamber liner 106 surrounds the pedestal 104 and defines a lower portion of an annular flow channel 110, with the upper portion of the annular flow channel 110 being defined by the vacuum lid 36. The pedestal 104 also includes resistively-heated components, such as an embedded single-loop heater element (not shown) configured to make two full turns in the form of parallel concentric circles. An outer portion (not shown) of the heater element runs adjacent to a perimeter of the pedestal 104, while an inner portion runs on the path of a concentric circle having a smaller radius. The wiring to the heater element passes through the stem 112 of the heater/lift assembly 102.

Typically, any or all of the process chamber liner 106, gas dispersion plate 62 and various other apparatus 26 hardware are made out of material such as aluminum, anodized aluminum, or ceramic. An example of such a CVD apparatus is described in U.S. Pat. No. 5,558,717 entitled "CVD Processing Chamber," issued to Zhao et al. The 5,558,717 patent is assigned to Applied Materials, Inc., the assignee of the present invention, and is hereby incorporated by reference in its entirety. The pedestal 104 may be formed from any process-compatible material, including, aluminum, anodized aluminum, aluminum nitride, or aluminum oxide ($Al_2O_3$ or alumina).

A processor 114 is in electrical communication with the apparatus 26 to regulate the operations thereof. Typically, the processor 114 is part of a single-board computer (SBC), that includes analog and digital input/output boards, interface boards and stepper motor controller boards. Various components of the CVD apparatus 26 conform to the Versa Modular European (VME) standard which defines board, card cage, as well as connector type and dimensions. The VME standard also defines the bus structure as having a 16-bit data bus and a 24-bit address bus. Functioning as a controller, the processor 114 executes system control software, which is a computer program stored in a memory 116, electronically coupled to processor 114. Any type of memory device may be employed, such as a hard disk drive, a floppy disk drive, a card rack or a combination thereof. The processor 114 operates under the control of the system control software, which includes sets of instructions that dictate the timing, mixture of gases, process chamber pressure, process chamber temperature, microwave power levels, pedestal position, and other parameters of a particular process, discussed more fully below with respect to FIG. 8.

Referring again to FIG. 3, during a deposition procedure, the vacuum lid 36 is placed in the closed position. The heater/lift assembly 102 places the support pedestal 104 in a processing position 118, disposed proximate to the vacuum lid 36. When placed in the processing position 118, the pedestal 104 is surrounded by the process chamber liner 106 and the annular flow channel 110. In this fashion, the pedestal 104 is located proximate to the gas distribution plate 62. Deposition and carrier gases are supplied via the supply lines 98 into the gas mixing manifold 96. The gas mixing manifold 96 causes the aforementioned gases to intermingle, forming the process gas, the path of which is shown as an arrow 126. Specifically, the process gas flows through the conduit 100, into the gas distribution assembly 46, and through the apertures 82 in the gas dispersion plate 62. In this fashion, the process gas travels into the process chamber 32 and is vented toward the pedestal 104, where a wafer (not shown) would be positioned and is uniformly radially distributed there across in a laminar flow.

The deposition process performed in CVD apparatus 26 can be either a thermal process or a plasma-enhanced process. In a plasma-enhanced process, an RF power supply 122 is included and in electrical communication with the process chamber 32 to apply electrical power between the gas distribution 62 plate and the pedestal 104. In this fashion, a process gas disposed therein is excited to form a plasma within the cylindrical region between the gas distribution plate 62 and the pedestal 104, defining a reaction region 124. Constituents of the plasma react to deposit a desired film on the surface of the semiconductor wafer supported on pedestal 104. Typically, the RF power supply 122 provides mixed frequency RF power in the range of 13.56 MHz to 360 KHz, inclusive. The mixed frequency RF power enhances the decomposition of reactive species introduced into the process chamber 32.

Were the deposition process thermal in nature, the RF power supply 122 could be abrogated. In a thermal deposition process, the process gas mixture reacts thermally to deposit the desired films on the surface of a semiconductor wafer (not shown) supported on pedestal 104. To that end, the pedestal 104 is resistively heated to provide thermal energy for the reaction.

During the deposition process it is beneficial to reduce the condensation of the process gases. To that end, the plasma generated during a plasma-enhanced deposition process heats the entire process chamber 32, including the chamber walls 126 surrounding the exhaust passageway 128 and the shut-off valve 130. In the absence of a plasma, e.g., during a thermal deposition process, a hot liquid is circulated through the walls 126 of the process chamber 32 to maintain the process chamber 32 at an elevated temperature. Fluids used to heat the process chamber walls 126 include the typical fluid types, i.e., water-based ethylene glycol or oil-based thermal transfer fluids. The aforementioned heating reduces the accumulation of volatile reactants in the process chamber 32 by reducing the condensation of the process gas on the walls 126 and in the aforementioned passages.

The portion of the process gas that is not deposited or does not condensate, is evacuated from the process chamber 32 by a vacuum pump (not shown). Specifically, the gases are exhausted through an annular, slot 132 surrounding the reaction region 124 and into the annular flow channel 110. The annular slot 132 and the annular flow channel 110 is defined by the gap between vacuum lid 36 and chamber liner 126. Both the annular slot 132 and the annular flow channel 110 have circular symmetry to provide uniform flow of process gases over the pedestal 104 so as to deposit a uniform film on the wafer (not shown).

From the annular flow channel 110, the gases flow through a lateral flow channel 134 in fluid communication therewith, past a viewing port (not shown), through the exhaust passageway 128, past the vacuum shut-off valve 130, and into an exhaust outlet 136 that connects to the external vacuum pump (not shown).

Figure 4:
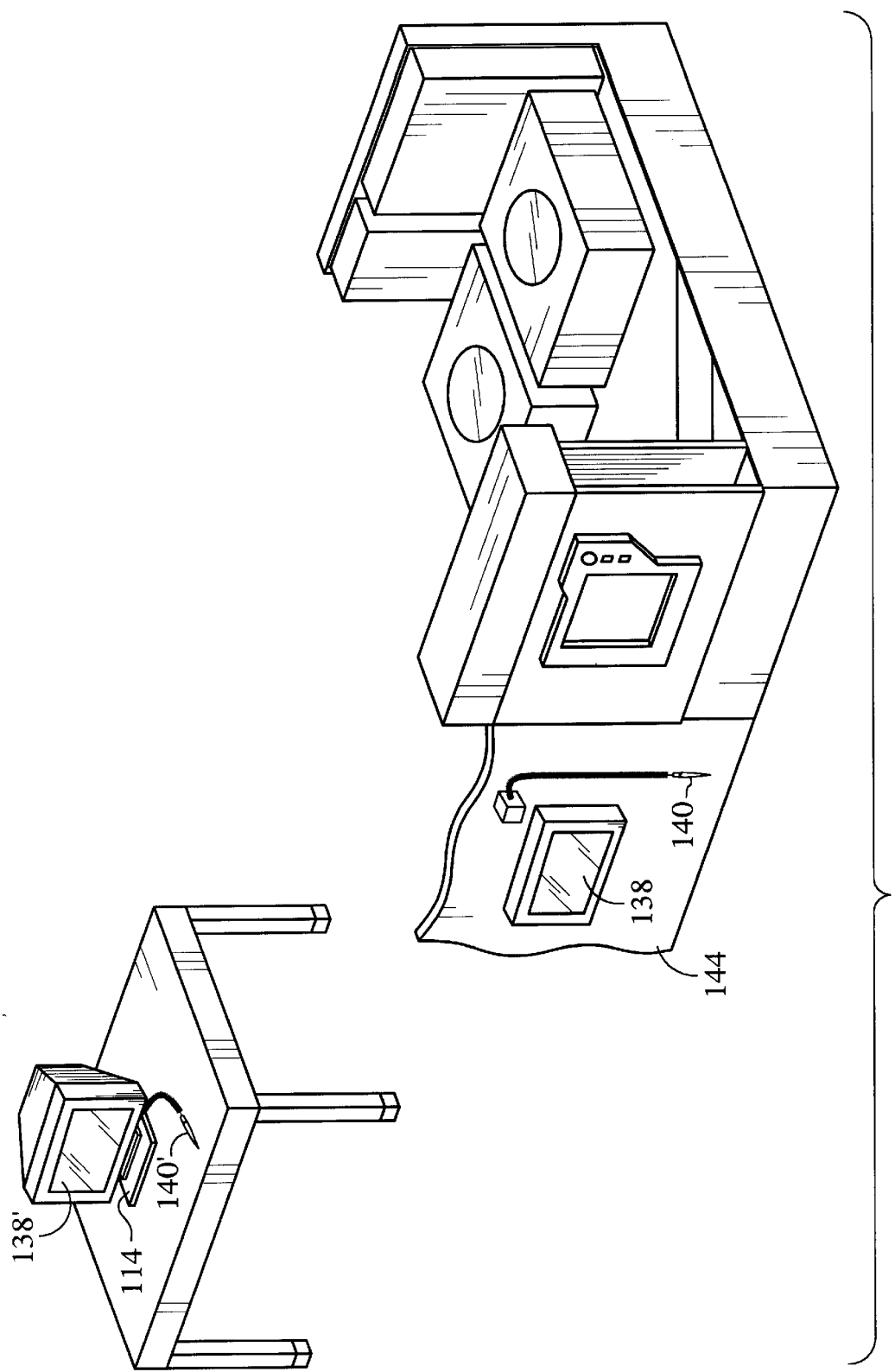
FIG. 4 is a simplified diagram of system monitor and a multi-chamber system employing one or more of the CVD apparatus shown above in FIG. 1.

The interface between a user and the processor 114 is via a CRT monitor 138 and light pen 140, shown in FIG. 4, which is a simplified diagram of the CRT monitor and CVD apparatus 26 in a substrate processing system 142, which may include one or more process chambers. In the preferred embodiment two monitors 138 are used, one mounted in a clean room wall 144 for the operators and the other behind the wall for the service technicians. The CRT monitors 138 simultaneously display the same information, but only one light pen 140 is enabled for data input during any given time. A light sensor (not shown) in the tip of light pen 140 detects light emitted by the CRT monitor 138. To select a particular screen or function, the operator touches a designated area of the CRT monitor 138 and pushes a button (not shown) on the light 140. The touched area provides a visual response, such as a change in color, or a new menu or screen being displayed, confirming communication between the light pen 140 and the CRT monitor 138. Other input devices, such as a keyboard, mouse, or other pointing or communication device, may be used instead of or in addition to the light pen 140 to allow the user to communicate with the processor 114.

The process for depositing the film can be implemented using a computer program product that is executed by the processor 114. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as the memory 116. If the entered code text is in a high level language, the code is compiled, and the resultant compiler code is then linked with an object code of precompiled Windows™ library routines. To execute the linked, compiled object code the system user invokes the object code, causing the processor 114 to load the code in the memory 116. The processor 114 then reads and executes the code to perform the tasks identified in the program.

Figure 5:
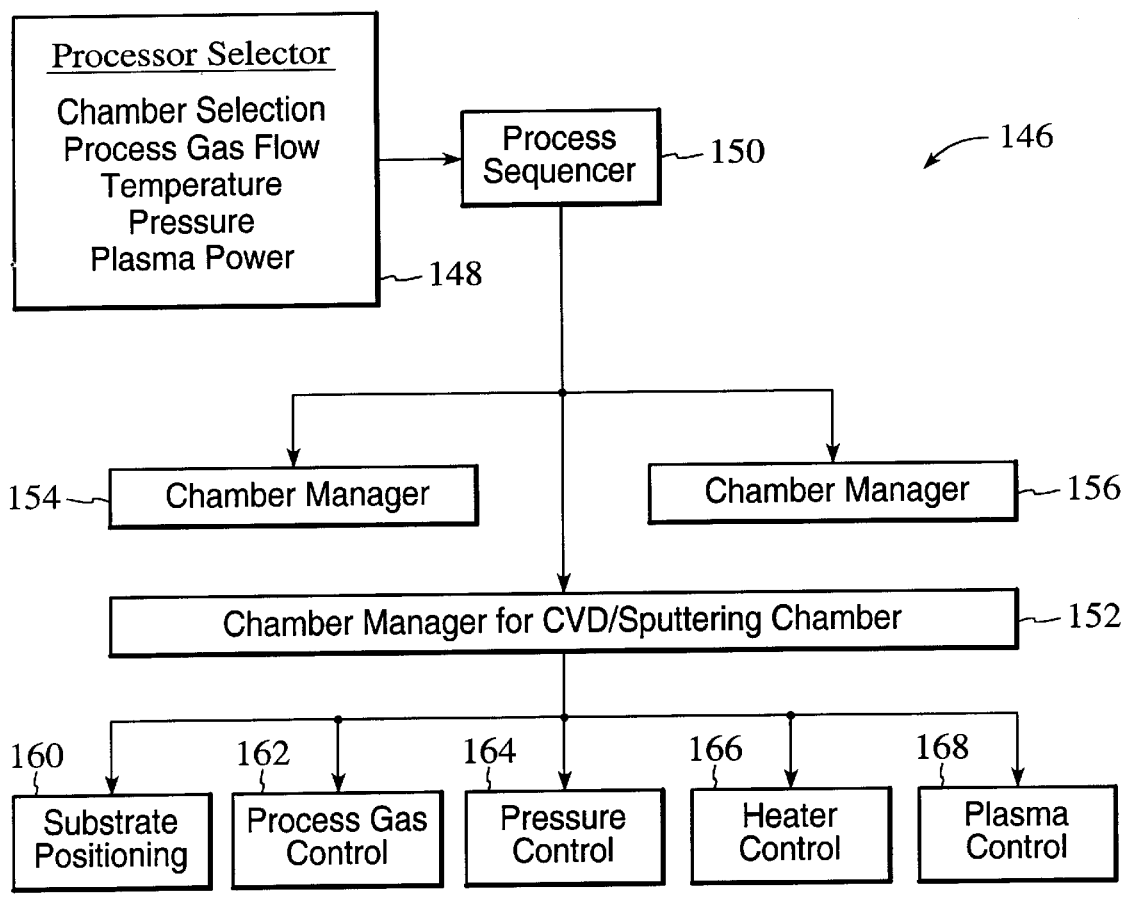
FIG. 5 is an illustrative block diagram of the hierarchical control structure of the system control software employed to control the operation of the CVD apparatus shown in FIG. 1.

Referring to both FIGS. 4 and 5, shown is an illustrative block diagram of the hierarchical control structure of the system control software, computer program 146, according to a specific embodiment. Using the light pen 140, a user enters a process set number and process chamber number into a process selector subroutine 148 in response to menus or screens displayed on the CRT monitor 138. The process sets are predetermined sets of process parameters necessary to carry out specified processes, and are identified by predefined set numbers. The process selector subroutine 148 identifies (i) the desired apparatus 26 and (ii) the desired set of process parameters needed to operate the process chamber 32 for performing the desired process. The process parameters for performing a specific process relate to process conditions such as, for example, process gas composition and flow rates, temperature, pressure, plasma conditions such as RF power levels and the RF frequency, cooling gas pressure, and process chamber wall temperature. These parameters are provided to the user in the form of a recipe, and are entered utilizing the light pen/CRT monitor interface. The signals for monitoring the process are provided by the analog and digital input boards of the system controller, and the signals for controlling the process are output on the analog and digital output boards of CVD apparatus.

A process sequencer subroutine 150 comprises program code for accepting the identified process chamber 32 and set of process parameters from the process selector subroutine 148, and for controlling operation of the various process chambers. Multiple users can enter process set numbers and process chamber numbers, or a user can enter multiple process set numbers and process chamber numbers, so the sequencer subroutine 150 operates to schedule the selected processes in the desired sequence. Preferably, the sequencer subroutine 150 includes a program code to perform the steps of (i) monitoring the operation of the process chambers to determine if the process chambers are being used, (ii) determining what processes are being carried out in the process chambers being used, and (iii) executing the desired process based on availability of a process chamber 32 and type of process to be carried out. Conventional methods of monitoring the process chambers can be used, such as polling. When scheduling which process is to be executed, sequencer subroutine 150 takes into consideration the present condition of the process chamber 32 being used in comparison with the desired process conditions for a selected process, or the "age" of each particular user entered request, or any other relevant factor a system programmer desires to include for determining scheduling priorities.

Once the sequencer subroutine 150 determines which process chamber and process set combination is going to be executed next, the sequencer subroutine 150 initiates execution of the process set by passing the particular process set parameters to a process chamber manager subroutine 152, 154 and 156, which controls multiple processing tasks in the process chamber 32 according to the process set determined by the sequencer subroutine 150. For example, the process chamber manager subroutine 152 comprises program code for controlling sputtering and CVD process operations in the process chamber 32. The process chamber manager subroutines 152, 154 and 156 also control execution of various process chamber component subroutines that control operation of the process chamber components necessary to carry out the selected process set. Examples of process chamber component subroutines are substrate positioning subroutine 160, process gas control subroutine 162, pressure control subroutine 164, heater control subroutine 166, and plasma control subroutine 168. Those having ordinary skill in the art will readily recognize that other process chamber control subroutines can be included depending on what processes are to be performed in the process chamber 32. In operation, the process chamber manager subroutine 152 selectively schedules or calls the process component subroutines in accordance with the particular process set being executed. The process chamber manager subroutine 152 schedules the process component subroutines much like the sequencer subroutine 150 schedules which process chamber 32 and process set are to be executed next. Typically, the process chamber manager subroutine 152 includes steps of monitoring the various process chamber components, determining which components need to be operated based on the process parameters for the process set to be executed, and causing execution of a process chamber component subroutine responsive to the monitoring and determining steps.

Referring to both FIGS. 4 and 5, the substrate positioning subroutine 160 comprises program code for controlling process chamber components that are used to load the substrate (not shown) onto the pedestal 104 and, optionally, to lift a substrate (not shown), disposed thereon, to a desired height in the process chamber 32 to control the spacing between the substrate (not shown) and the gas distribution plate 62. When the substrate (not shown) is loaded into the process chamber 32, the pedestal 104 is lowered to receive the substrate, and thereafter, the pedestal 104 is raised to the desired height in the process chamber 32, to maintain the substrate (not shown) at a first distance or spacing from the gas distribution plate 62 during the CVD process. In operation, the substrate positioning subroutine 160 controls movement of the pedestal 104 in response to process set parameters related to the support height that are transferred from the process chamber manager subroutine 152.

The process gas control subroutine 162 has program code for controlling process gas composition and flow rates. The process gas control subroutine 162 controls the open/close position of the safety shut-off valves (not shown), and also ramps up/down the mass flow controllers to obtain the desired gas flow rate. The process gas control subroutine 162 is invoked by the process chamber manager subroutine 152, as are all process chamber component subroutines, and receives from the process chamber manager subroutine process parameters related to the desired gas flow rates. Typically, the process gas control subroutine 162 operates by opening the gas supply lines and repeatedly (i) reading the necessary mass flow controllers, (ii) comparing the readings to the desired flow rates received from the process chamber manager subroutine 152, and (iii) adjusting the flow rates of the gas supply lines as necessary. Furthermore, the process gas control subroutine 162 includes steps for monitoring the gas flow rates for unsafe rates and for activating the safety shut-off valves when an unsafe condition is detected.

In some processes, an inert gas such as helium or argon is flowed into the process chamber 32 to stabilize the pressure in the process chamber 32 before reactive process gases are introduced. For these processes, the process gas control subroutine 162 is programmed to include steps for flowing the inert gas into the process chamber 32 for an amount of time necessary to stabilize the pressure in the process chamber 32, and then the steps described above would be carried out. Additionally, when a process gas is to be vaporized from a liquid precursor, for example, tetraethylorthosilane ("TEOS"), the process gas control subroutine 162 is written to include steps for bubbling a delivery gas, such as helium, through the liquid precursor in a bubbler assembly or introducing a carrier gas, such as helium or nitrogen, to a liquid injection system. When a bubbler is used for this type of process, the process gas control subroutine 162 regulates the flow of the delivery gas, the pressure in the bubbler, and the bubbler temperature in order to obtain the desired process gas flow rates. As discussed above, the desired process gas flow rates are transferred to the process gas control subroutine 162 as process parameters. Furthermore, the process gas control subroutine 162 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 162 comprises program code for controlling the pressure in the process chamber 32 by regulating the size of the opening of the throttle valve in the exhaust system of the process chamber. The size of the opening of the throttle valve is set to control the process chamber pressure to the desired level in relation to the total process gas flow, size of the process chamber, and pumping set point pressure for the exhaust system. When the pressure control subroutine 164 is invoked, the desired, or target, pressure level is received as a parameter from the process chamber manager subroutine 152. The pressure control subroutine 164 operates to measure the pressure in the process chamber 32 by reading one or more conventional pressure manometers connected to the process chamber, to compare the measure value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 164 can be written to open or close the throttle valve to a particular opening size to regulate the process chamber 32 to the desired pressure.

The heater control subroutine 166 comprises program code for controlling the current to a heating unit that is used to heat the pedestal 104 and therefore, a substrate (not shown) disposed on the pedestal 104. The heater control subroutine 166 is also invoked by the process chamber manager subroutine 152 and receives a target, or set-point, temperature parameter. The heater control subroutine 166 measures the temperature by measuring voltage output of a thermocouple located in the pedestal 104, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat the pedestal 104, the heater control subroutine 166 gradually controls a ramp up/down of current applied to the loop. Additionally, a built-in fail-safe mode can be included to detect process safety compliance, and can shut down operation of the heating unit if the process chamber 32 is not properly set up.

The plasma control subroutine 168 comprises program code for setting the low and high frequency RF power levels applied to the process electrodes in the process chamber 32, and for setting the low frequency RF frequency employed. Similar to the previously described process chamber component subroutines, the plasma control subroutine 168 is invoked by the process chamber manager subroutine 152.

The above reactor description is mainly for illustrative purposes, and other plasma CVD equipment such as electron cyclotron resonance (ECR) plasma CVD devices, induction coupled RF high density plasma CVD devices, or the like may be employed. Additionally, variations of the above-described system, such as variations in pedestal design, heater design, RF power frequencies, location of RF power connections and others are possible. For example, the wafer could be supported by a pedestal and heated by quartz lamps. The layer and method for forming such a layer of the present invention is not limited to any specific apparatus or to any specific plasma excitation method.

II. Depositing Tungsten Layers

Figure 6:
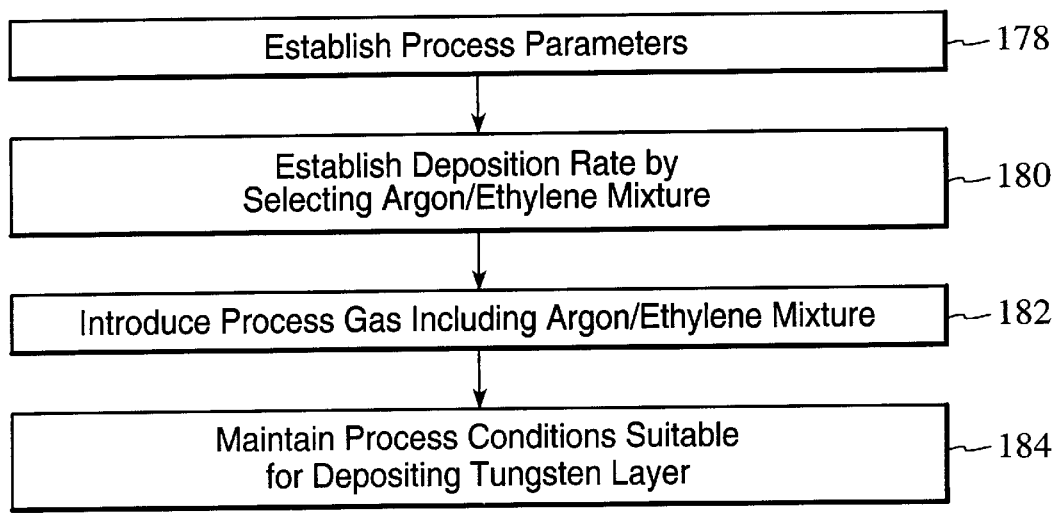
FIG. 6 is a flowchart illustrating the steps of a preferred embodiment of the present invention.

The method of the present invention may be employed to deposit improved refractory metal layers, such as tungsten, in a substrate process chamber such as the exemplary CVD chamber described above with reference to FIGS. 1–5. FIG. 6 illustrates a preferred process of the invention for depositing a refractory metal layer onto a substrate. The process described is with respect to use of a refractory metal layer to form a contact that is deposited atop of a diffusion barrier layer such as TiN. However, this description is for exemplary purposes, because the process may be employed to increase the deposition rate of other refractory metal layers including a refractory metal layer deposited over a semiconductor substrate to form metal interconnect lines. Where applicable, reference numbers in the description below are used to refer to appropriate components of the exemplary chamber 12 of FIGS. 1–5. This process is implemented and controlled using a computer program stored in the memory 46 of the CVD system 10.

Referring to FIGS. 3 and 6, the method includes the step 170 of placing the substrate 16 in the deposition zone, located proximate to the processing position 118. Although the substrate may have virtually any topography, the substrate 16 typically has stepped surfaces, shown more clearly in FIG. 7. To that end, the substrate 16 may have one or more film layers, shown as 172 and 174. The film layer 172 is typically etched to form one or more vias 176, before deposition of a refractory metal layer employing the present invention. After the substrate 16 is placed in the deposition zone, the process parameters, such as pressure and temperature of the process chamber 32, are established at step 178, shown in FIG. 6. At step 180, the deposition rate, for a given set of process parameters established at step 178, is established by selecting an argon/ethylene mixture to be included in a process gas. Thereafter, at step 182, the process gas is introduced into the process chamber 32. The process conditions are then maintained to deposit a tungsten film layer of a desired thickness at step 184.

Figure 7:
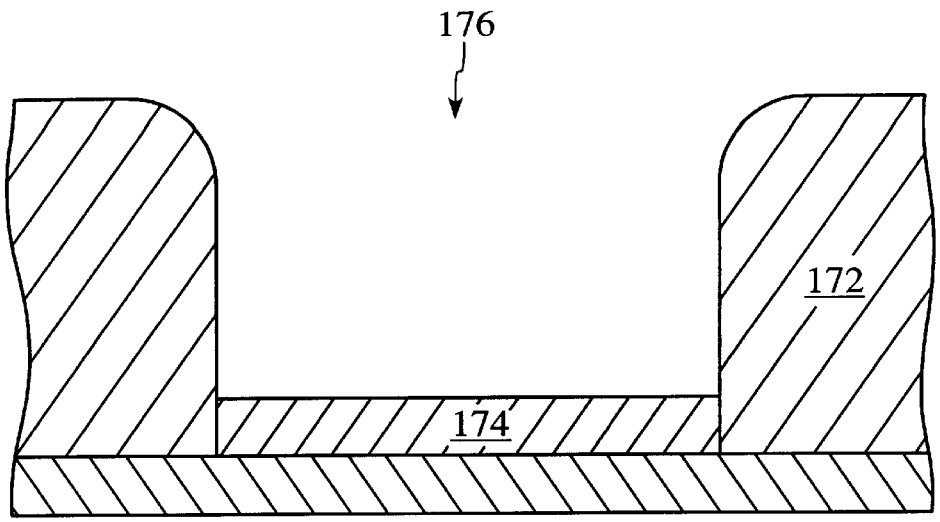
FIG. 7 is a cross-sectional view of a portion of an integrated circuit in which a refractory metal layer is deposited in accordance with the present invention.
Figure 8:
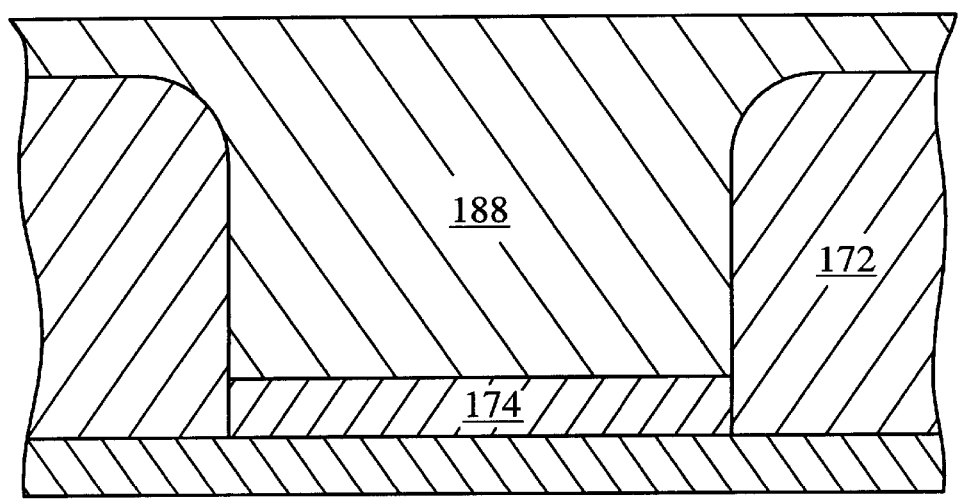
FIG. 8 is a cross-sectional view of the integrated circuit shown in FIG. 7 with a refractory metal layer disposed thereon in accordance with the present invention.

Referring to both FIGS. 7 and 8, in an exemplary embodiment, layer 172 is formed from a dielectric, such as silicon dioxide, and layer 174 is formed from titanium nitride (TiN). Layer 188 is a tungsten layer formed from a refractory metal source, such as tungsten hexafluoride $WF_6$. At step 178 shown in FIG. 6, the process parameters are established so that the pressure of the atmosphere in the process chamber 32 is in the range of 1 to 400 torr, with 3.0 to 100 torr being preferred. The temperature is also established during step 178 to be in the range of 300 to 500° C., with 475° C. being preferred.

Figure 9:
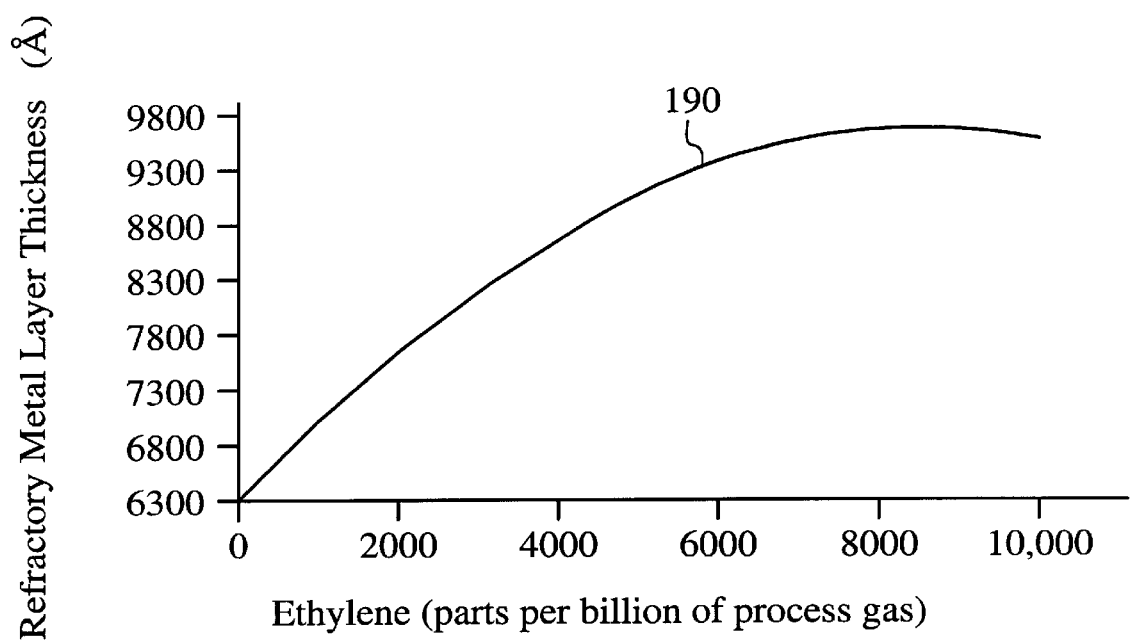
FIG. 9 is a graph depicting the thickness of the refractory metal layer shown in 8 versus the quantity of hydrocarbons in the process gas, for a fixed deposition time.

During step 180, the deposition rate for the layer to be deposited is established for the process parameters established during step 178 by selecting a gas having a homogenous mixture of an inert gas and a hydrocarbon. Specifically, it was discovered that including ethylene in a process gas of a semiconductor process affected the deposition rate of refractory metal layers. It is believed that the carbon present in ethylene accelerates nucleating of the surface onto which the refractory metal layer is to be deposited. As seen in the graph in FIG. 9, the thickness of a refractory metal layer is shown for fixed duration of deposition time versus the quantity of ethylene present in the process gas. The deposition includes a three minute bulk deposition step preceded by a forty-five second nucleation step. With approximately 8,500 parts of ethylene being present for every 1,000,000,000 parts of the process gas, an approximately 9,700 Å thick tungsten layer was deposited. This is compared to an approximately 8,700 Å thick tungsten layer being deposited in the same amount of time when the ethylene content of the process gas is 4,000 parts of ethylene for 1,000,000,000 parts of the process gas. As seen, by the slope of the line 190, the maximum thickness was obtained with a mixture of approximately 8,000 parts of ethylene for every 1,000,000,000 parts of the process gas. It is critical, however, not to exceed 10,000 parts of ethylene for every 1,000,000,000 part of the process gas, in order to maximize deposition of tungsten. The deposition rate continues to decline at higher levels. However, additional ethylene could be introduced into the process gas to exceed levels reaching 250,000 parts for every 1,000,000,000 parts of process gas. In this manner, the deposition rate could be controlled, for a given set of process parameters, employing higher levels ethylene. Additionally, it is critical to maintain the ethylene level so as to be greater than 100 part for every 1,000,000,000 parts of process gas. Purification of a gas, either argon, tungsten hexafluoride or some other gas, to have lower levels of ethylene present therein greatly increases the cost of the same. After the requisite quantity of ethylene has been determined, the process gas is introduced into the deposition zone 118, at step 184. As discussed above, the process gas includes a refractory metal source, such as tungsten hexafluoride, $WF_6$, ethylene, $C_2H_4$, and argon, Ar. The flow rate of tungsten hexafluoride is between 60 and 200 sccm, with 95 sccm being preferred. The flow rate of the argon gas is between 500 and 6,000 sccm with 1,000 being preferred, depending upon the chamber temperature. The process conditions are then maintained to deposit a tungsten film layer of a desired thickness at step 186.

Figure 10:
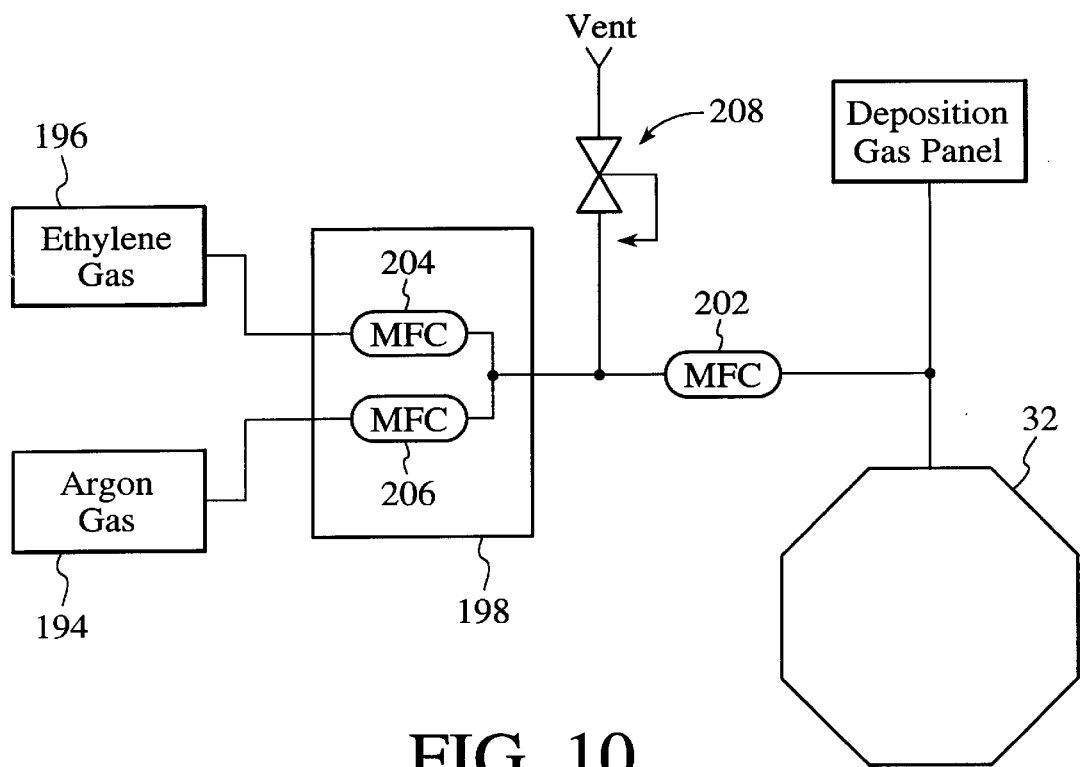
FIG. 10 is a schematic view showing an hydrocarbon delivery system in accord with the present invention.

Referring to FIG. 10, an apparatus 192 for in situ mixing the ethylene with either the argon gas or tungsten hexafluoride gas is shown, but is discussed with respect to the argon gas only for simplicity. The apparatus 192 includes a supply of argon gas 194 and a supply of ethylene 196 in fluid communication with a mixing manifold 198. The mixing manifold 198 is in fluid communication with the process chamber 32 via a primary mass flow controller (MFC) 202. The mixing manifold 198 includes two MFCs one of which is in fluid communication with the supply of ethylene gas, MFC 204, and the remaining MFC 206 is in fluid communication with the supply of argon gas 194. A flow control valve 208 is coupled to selectively vent the argon/ethylene mixture exiting from the mixing manifold 198 before the same enters the primary MFC 202. A supply of deposition gases, such as tungsten hexafluoride, is coupled between the process chamber 32 and the primary MFC 202 and in fluid communication therewith. The mixing manifold 198 may be controlled in any conventional manner, e.g., under control of a processor (not shown) to provide the quantity of ethylene 196 desired.

Figure 11:
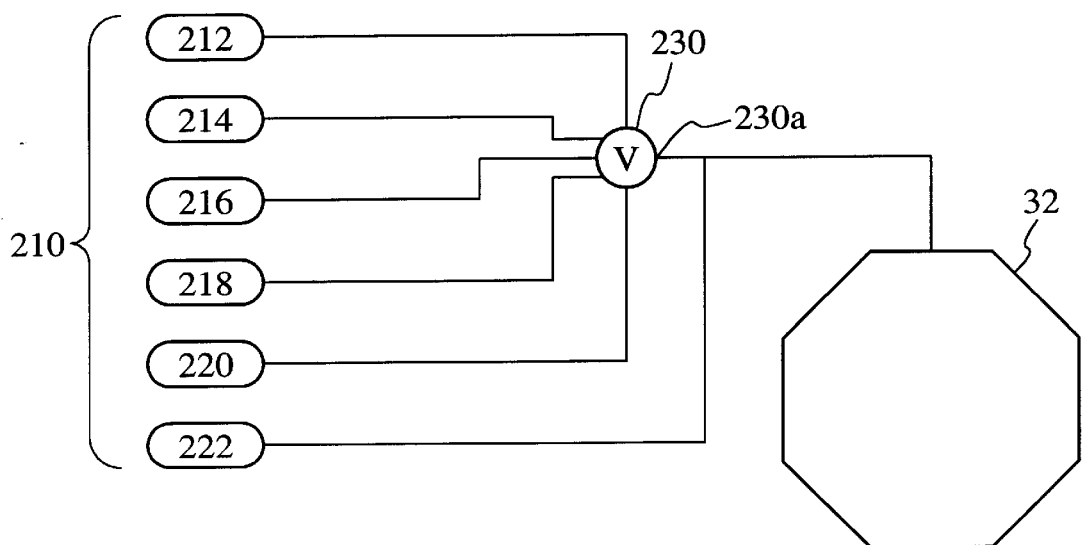
FIG. 11 is an alternate embodiment of the hydrocarbon delivery system in accord with the present invention.

Referring to FIG. 11, in an alternate embodiment, an array of gas containers 210 may be provided with a subset of the array of gas containers 212, 214, 216, 218 and 220 containing argon/ethylene gas mixtures of varying proportions. For example, container 212 may provide a homogeneous mixture of argon/ethylene gas so that there are 100 parts of ethylene for every 1,000,000,000 part of argon present. Container 214 may contain 1,000 parts of parts of ethylene for every 1,000,000,000 part of argon present, container 216 may contain 5,000 parts of ethylene for every 1,000,000,000 part of argon present, and so on. Although five containers are shown, any number of containers may be present providing any proportion desired. The containers are in fluid communication with the process chamber 32 so that the gas may be delivered thereto. Also included in the array of gas containers 210 is a supply of deposition gas shown as container 222. In this case, as before, the deposition gas is tungsten hexafluoride. An input 230a switching valve 230 is coupled between the process chamber 32 and the containers 212, 214, 216, 218 and 220. The switching valve selects which container 212, 214, 216, 218 or 220 is place in fluid communication with the process chamber 32, which is in fluid communication with the outlet 230b of the switching valve 230. Also in fluid communication with the process chamber 32 is the supply of deposition gas 222. In this fashion, the process gas entering the process chamber 32 is a combination of tungsten hexafluoride and the argon/ethylene mixture. Operation of the switching valve 230 may be achieved under control of a processor (not shown). This allows varying the argon/ethylene mixture entering the process chamber 32 by switching between the various containers of the array of gas containers 210.

Finally, varying of the argon/ethylene mixture may be achieved by time multiplex delivery of the argon/ethylene mixture in two or more of the containers of the array 210. In this manner, the switching valve 230 allows different containers 212, 214, 216, 218 and 220 to be selectively placed in fluid communication with the process chamber 32 for a predetermined amount of time during deposition of a refractory metal film. The amount of time would be dependent upon the argon/ethylene mixture desired. Time multiplex delivery would reduce the number of differing mixtures of argon/ethylene gas required to achieve the desired argon/ethylene mixture in the process chamber 32. The scope of the invention should, therefore, be determined not with reference to the above description, but instead should be determined with reference to the appended claims along with their full scope of equivalents. Alternatively, each of the containers of the array 210 have been described as containing a predetermined mixture of argon and ethylene. The ethylene may, however, be easily introduced into the process gas by having containers including mixtures of a refractory metal source, such as tungsten hexafluoride, and ethylene.

What is claimed is:

1. A method for controlling a deposition rate of a refractory metal layer on a substrate positioned proximate to a deposition zone of a semiconductor process chamber, said method comprising:

flowing, into said process chamber, a deposition gas including a refractory metal source and an inert carrier gas;

maintaining said deposition zone at process conditions suitable for depositing said refractory metal layer on said substrate; and adding a selected amount of a source of hydrocarbons to said deposition gas in order to increase said deposition rate of said refractory metal layer.

2. The method as recited in claim 1 wherein said source of hydrocarbons comprises ethylene.

3. The method as recited in claim 1 wherein introducing said source of hydrocarbons further includes providing a mixture of said inert carrier gas and said source of hydrocarbons and combining said mixture with said refractory metal source.

4. The method as recited in claim 1 wherein introducing said source of hydrocarbons further includes providing a mixture of said refractory metal source and said source of hydrocarbons and combining said mixture with said inert carrier gas.

5. The method as recited in claim 1 further including selectively varying said quantity.

6. The method as recited in claim 1 wherein said quantity is no less than 1 part of said source of hydrocarbons for every 10,000,000 parts of said process gas.

7. The processing system as recited in claim 1 wherein said quantity is no greater than 1 part of ethylene for every 100,000 parts of said process gas.

8. The method as recited in claim 1 wherein said refractory metal source comprises tungsten-hexafluoride.

9. The method as recited in claim 1 wherein a temperature of said deposition zone is in the range of 300 to 500° C.

10. A method for depositing a refractory metal layer on a substrate positioned proximate to a deposition zone of a semiconductor process chamber, said method comprising:

flowing, into said process chamber, a process gas including a refractory metal source, an inert carrier gas, and a hydrocarbon; and maintaining said deposition zone at process conditions suitable for depositing said refractory metal layer, wherein a quantity of said hydrocarbon is between about 100 and 10,000 parts per billion parts of said process gas.

11. The method as recited in claim 10 wherein a deposition rate of said metal layer using said process gas with said hydrocarbon is greater than a deposition rate of said metal layer with a process gas without said hydrocarbon.

12. The method as recited in claim 11 wherein said refractory metal source comprises tungsten-hexafluoride.

13. The method as recited in claim 11 wherein said inert carrier gas is argon.

14. The method as recited in claim 13 wherein a temperature of said deposition zone is in the range of 300 to 500° C.

15. A method for depositing a tungsten layer on a substrate positioned proximate to a deposition zone of a semiconductor process chamber, said method comprising:

flowing a deposition gas including tungsten-hexafluoride, a reducing agent, and an inert carrier gas into said process chamber; and adding ethylene to said deposition gas to increase a deposition rate of said tungsten layer for a given set of process conditions suitable for depositing said tungsten layer.

\* \* \* \* \*